Oct. 24, 1967 G. STARK ETAL 3,348,987

METHOD OF PRODUCING THIN LAYERS OF GALVANOMAGNETIC SEMICONDUCTOR MATERIAL, PARTICULARLY HALL GENERATORS OF $A^{III} B^{V}$ COMPOUNDS

Filed July 17, 1964

United States Patent Office 3,348,987

Patented Oct. 24, 1967

3,348,987

METHOD OF PRODUCING THIN LAYERS OF GALVANOMAGNETIC SEMICONDUCTOR MATERIAL, PARTICULARLY HALL GENERATORS OF $A^{III}B^{V}$ COMPOUNDS

Gustav Stark and Klaus Otto, Nuremberg, Germany, assignors to Siemens-Schuckertwerke Aktiengesellschaft, Berlin-Siemensstadt, Germany and at Erlangen, Germany, a German corporation Filed July 17, 1964, Ser. No. 383,528

Claims priority, application Germany, July 20, 1963, S 86,298

2 Claims. (Cl. 156—17)

Our invention relates to a method of producing thin layers of films of galvanomagnetic semiconductor material.

It is known that galvanomagnetic semiconductors, particularly Hall generators, exhibit favorable operating properties if used in layers of smallest feasible thickness. As a rule, a layer thickness down to about 5μ and less is employed. Since wafers and layers of such thickness cannot be produced without a reinforcing support or substrate, preground wafers of about 10 to 100μ have been cemented upon a substrate, for example of ceramic or sintered ferrite, and have then been reduced in thickness by anodic electrolytic treatment. This anodic etching, however, involves several disadvantages. Complicated masking is necessary. The anodic etching must be individually performed on each wafer in individual stages with interposed washing operations for removing an evolving detrimental coating. Furthermore, there is a tendency toward formation of bulging and hence pillow-shaped products because the anodic etching (elimination) occurs predominantly in the immediate vicinity of the current supply leads.

Our invention has as an object to provide a simpler and more effective method, of producing thin layers of galvanomagnetic semiconductor material, which readily results in accurately planar parallel and smooth surfaces, and which is suitable for mass production.

According to our invention, we pregrind the semiconductor layers, attached to reinforcing substrates, and then subject the layers on the substrates to the effect of a material-dissolving chemical treatment. We use an etching solution, which contains a free halogen or a halogen liberated by the reaction, and a polishing substance to reduce the layer thickness to the ultimately desired value by simultaneous etching and chemical polishing.

The method according to the invention does not require an electrolysis equipment and furnishes satisfactorily smooth and planar surfaces at a rate of removal largely selectable at will.

The method of the invention will be described in the following with reference to the accompanying drawing in which.

Figure 1:
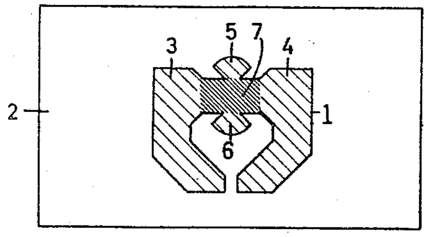
FIG. 1 is a plan view of a galvanomagnetic semiconductor layer on a ferrite substrate.

According to FIG. 1, a semicondutcor layer 1 adheres on the planar top surface of a reinforcing substrate of sintered ferrite 2. The semiconductor layer 1 consists of indium antimonide or indium arsenide and has a configuration as desired for a Hall generator inclusive of its current-supply leads and its Hall electrodes. The semiconductor layer can be produced from an originally rectangular foil cemented onto the surface of the substrate 2 and then shaped by a suitable contour etching process as conventional for such purposes. The layer has a thickness of 25μ. The parts 3 and 4 of the layer are subsequently used as current-supply terminals. The parts 5 and 6 of the layer constitute the Hall electrodes. The rectangular central region 7 of the layer constitutes the Hall generator proper, namely the portion which is subsequently subjected to a magnetic field while being traversed by a current between the terminals 3 and 4 in order to then produce an output voltage between electrodes 5 and 6. The above-mentioned different portions of the layer are differently hatched for the purpose of distinguishing them from one another.

Accordingly to our method, only the central semiconductor region 7 is reduced to a thickness of 5μ, whereas the parts 3, 4, 5 and 6 retain the original 25μ thickness of the layer. For this purpose, the semiconductor layer is masked-off so that only the rectangular central region 7 remains exposed. The masking may be effected in the conventional manner, for example by means of a masking varnish. It will be understood that the particular shape of the semiconductor member and the described sequence of operations are not essential to the invention proper but are mentioned only by way of example. The production of the semiconductor layer, of course, may also be effected in any other suitable manner, and the method steps may be performed in a different sequence.

Figure 2:
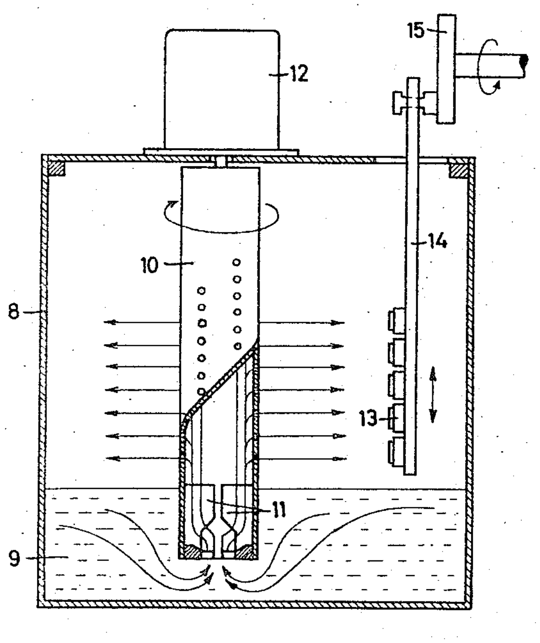
FIG. 2 shows schematically and in section an etching centrifuge for simultaneously processing a number of semiconductor components according to FIG. 1.

The apparatus shown in FIG. 2 comprises a vessel 8 for receiving the processing liquid 9 to be further described in the examples. An acid-resistant synthetic plastic tubular structure 10 has its lower portion immersed in the liquid. The temperature of the solution is preferably kept at 25° C. Mounted in the lower portion of the tubular structure 10 are four vertical blades 11, and the cylindrical wall is provided with holes of about 0.5 mm. diameter. During operation, a motor 12 maintains the tube 10 in rapid rotation, for example at 2,500 r.p.m. The processing liquid entering into the tube 10 is entrained by the rotating blades 11. Due to centrifugal force, the solution rises inwardly along the tube wall and is flung through the fine holes tangentially into the surrounding space, thus producing a substantially horizontal spray of liquid. A number of semiconductor components 13, prepared by masking as described above, have their substrates attached to a holder 14 and are exposed to the fine spray issuing from the rotating tube 10. The holder 14 is moved up and down by an eccentric 15 mounted on a continuously rotating shaft, thus ensuring a uniform distribution of the spray onto the semiconductor layers. In the etching centrifuge, the regions 7, originally having the thickness of 25μ corresponding to that of the adjacent layer portions, are reduced to a thickness of 5μ.

To eliminate any uncertainty that may result from variations in the rate of elimination, another semiconductor layer to serve as indicator may be placed into the etching centrifuge together with the assembly of Hall generators 13. This additional layer has a thickness corresponding to the thickness of the material to be eliminated or, in the present case, a thickness of 20μ. The additional semiconductor layer is preferably supported on a contrasting carrier or substrate, for example a white plate of ceramic, which serves as an indicator. When the indicator layer is completely eliminated, this being readily visible since the contrasting substrate becomes exposed, the Hall generators in the assembly being processed have been reduced to the desired residual thickness of 5μ. Consequently, the rate of etching and hence the etching period need not be fixed in advance or need not be accurately observed. The indicator layer may also be utilized for automatically discontinuing the process, for example by means of an optically-electrical sensor which stops the motor 12 and may also initiate any rinsing operation.

Figures 3, 4:
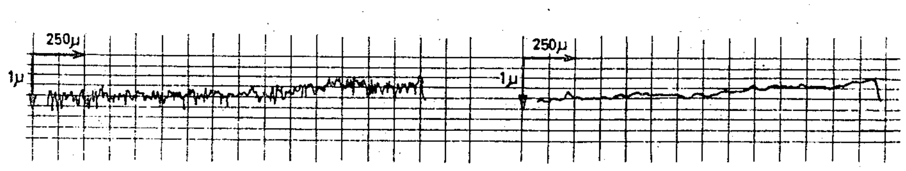
FIGS. 3 and 4 are explanatory graphs relating to results obtained by a method of the invention.

FIGS. 3 and 4 illustrate the results of the method according to the invention. FIG. 3 represents on enlarged scale the surface roughness of a ground surface on a layer of indium antimonide; and FIG. 4 shows the corresponding surface roughness after chemical polishing according to the invention. The improvement in planar shape obtained by the chemical polishing is apparent.

The free or liberated halogen in the etching solution removes the semiconductor material, whereas the polishing action is due to the added chemical polishing substance.

Suitable processing liquids for performing the method are described in conjunction with the following examples which are by way of illustration only and not limitative of the invention.

*Example 1*

To an etching solution of $FeCl_3$ of about 30% concentration was added one of the following: glycerin, glycol, glucose, starch, gelatin, mucilage (gum arabic) and dextrin. The desired polishing effect is achieved with any of these additions in the apparatus of FIG. 2 commencing from a certain concentration. Starch, gelatin, gum arabic and dextrin, however, tend to foam, which presents difficulties since care must then be taken for a uniform concentration at the semiconductor material by shaking, stirring, spraying, or the like.

We have found it best suitable, therefore, to use as the polishing addition at least 1, preferably 2 volumetric parts of glycerin to 5 volumetric parts of $FeCl_3$ solution. This etching and polishing liquid is particularly well suitable for the processing of indium antimonide, constituting a material which, aside from indium arsenide, is usually preferred in Hall generators and other galvanomagnetic semiconductor members.

*Example 2*

The processing liquid has the composition: 77 g. copper chloride ($CuCl_2 \cdot 2H_2O$), 200 cc. water, 100 cc. of glycerin, 7.5 cc. of bromine. A good polishing action was obtained using this solution, particularly on indium arsenide. The ratio of ingredients can be changed within wide limits with a variation in effect only on the rate of elimination.

*Example 3*

The processing liquid consisted of 400 cc. acetic acid ($CH_3COOH$) and 10 cc. bromine. Chloride may be substituted for the bromine. Both solutions are very well suitable for eliminating material from layers of indium antimonide and indium arsenide. Changes in mixing ratio affect the rate of etching.

*Example 4*

The processing solution was composed of the following:

(a) a saturated chromic acid ($CrO_3$) solution;
(b) a saturated copper chloride ($CuCl_2 \cdot 2H_2O$) solution and/or a saturated ferric chloride ($FeCl_3$) solution or concentrated hydrochloric acid (HCl);
(c) concentrated sulfuric, phosphoric, or acetic acid.

The three components *a*, *b* and *c* can be used for example in the ratio 1:1:1 to 1:1:4. All of these solutions are well suitable for the processing of indium antimonide and indium arsenide.

The use of an etching liquid consisting of ferric chloride and glycerin as described in Example 1 when employed in a centrifuging process as described with reference to FIG. 2 results in the elimination of approximately $1\mu$/min. During slow dissociation of the solution over several days, the elimination rate increases first only to a negligible extent, but thereafter more and more rapidly. This change in elimination rate does not present problems within very wide limits, when the process is performed with the aid of the above-mentioned indicator layer.

The method according to the invention is also applicable for the processing of other semiconductor materials in order to produce extremely thin layers for magnetic-field responsive electrical components, although different etching solutions and polishing additions may then be preferable. Instead of centrifugal apparatus, other equipment may be used provided care is taken that a substantially uniform concentration of the processing liquid is presented to the semiconductor layer. Illustratory of such equipment are shaking baths and similar equipment.

"Halogen" as used herein and in the appended claims is to be understood to encompass only chlorine and bromine.

We claim:

1. The method of producing thin layers of indium antimonide and indium arsenide, which comprises pregrinding the layers on substrates to a given thickness, and subjecting the layers on the substrates to simultaneous etching and chemical polishing in an aqueous ferric chloride solution containing an addition of glycerin in a volumetric ratio of at least one part glycerin to five parts solution, and thereby reducing the layer to ultimate thickness.

2. The method of producing thin layers of indium antimonide and indium arsenide, which comprises pregrinding the layers on substrates to a given thickness between 10 and 100 microns, and subjecting the layers on the substrates to simultaneous etching and chemical polishing in saturated ferric chloride solution containing an addition of about two volumetric parts glycerin to five parts solution, and thereby reducing the layer to ultimate thickness.

References Cited

UNITED STATES PATENTS

| | | | |
|---|---|---|---|
| 2,592,729 | 4/1952 | Pennell | 156—17 |
| 2,738,259 | 3/1956 | Ellis | 156—17 |
| 2,762,036 | 9/1956 | Triman | 340—267 |
| 2,847,287 | 8/1958 | Landgren | 156—17 |
| 2,927,011 | 3/1960 | Stead | 156—17 |
| 3,262,825 | 7/1966 | Fuller | 156—17 |

JACOB H. STEINBERG, *Primary Examiner.*